United States Patent
Seong

(10) Patent No.: US 9,230,650 B2
(45) Date of Patent: Jan. 5, 2016

(54) SEMICONDUCTOR DEVICE AND METHOD FOR OPERATING THE SAME

(71) Applicant: SK HYNIX INC., Icheon (KR)

(72) Inventor: Jin Yong Seong, Seoul (KR)

(73) Assignee: SK HYNIX INC., Icheon (KR)

( * ) Notice: Subject to any disclaimer, the term of this patent is extended or adjusted under 35 U.S.C. 154(b) by 31 days.

(21) Appl. No.: 14/166,677

(22) Filed: Jan. 28, 2014

(65) Prior Publication Data

US 2015/0109840 A1    Apr. 23, 2015

(30) Foreign Application Priority Data

Oct. 21, 2013   (KR) .................. 10-2013-0125143

(51) Int. Cl.
| | | |
|---|---|---|
| G11C 15/04 | (2006.01) | |
| G06F 11/10 | (2006.01) | |
| G11C 16/10 | (2006.01) | |
| G11C 16/20 | (2006.01) | |

(52) U.S. Cl.
CPC .............. *G11C 15/046* (2013.01); *G06F 11/10* (2013.01); *G11C 16/102* (2013.01); *G11C 16/105* (2013.01); *G11C 16/20* (2013.01)

(58) Field of Classification Search
USPC ........................................................ 365/49.1
See application file for complete search history.

(56) References Cited

U.S. PATENT DOCUMENTS

| | | | | |
|---|---|---|---|---|
| 6,978,343 | B1* | 12/2005 | Ichiriu ................... | G11C 15/00 365/49.1 |
| 7,304,875 | B1* | 12/2007 | Lien ..................... | G06F 11/1064 365/200 |
| 7,885,111 | B2* | 2/2011 | Chae et al. ............... | 365/185.09 |
| 8,161,355 | B2 | 4/2012 | Fung et al. | |
| 8,228,701 | B2* | 7/2012 | Sokolov ................... | G11C 7/02 365/185.03 |
| 8,711,626 | B2* | 4/2014 | Lee ......................... | 365/185.11 |
| 8,930,753 | B2* | 1/2015 | Hillman et al. ............... | 714/12 |
| 2003/0035322 | A1* | 2/2003 | Wong ..................... | G11C 5/025 365/185.33 |
| 2003/0090943 | A1* | 5/2003 | Okuyama et al. ............. | 365/200 |
| 2009/0168585 | A1* | 7/2009 | Kang ..................... | G11C 5/143 365/226 |
| 2012/0250412 | A1* | 10/2012 | Lee ........................ | G11C 16/12 365/185.11 |
| 2014/0157093 | A1* | 6/2014 | Achir ................ | H03M 13/1111 714/776 |

FOREIGN PATENT DOCUMENTS

| | | |
|---|---|---|
| KR | 10-0764748 B1 | 10/2007 |
| KR | 10-1184305 B1 | 9/2012 |

* cited by examiner

*Primary Examiner* — Hoai V Ho
*Assistant Examiner* — Minh Dinh

(57) ABSTRACT

A semiconductor device employs a technology for improving data retention characteristics of a cell array storing data regarding conditions for controlling internal operations of the semiconductor device. The semiconductor device includes a content addressable memory (CAM) cell array configured to store CAM data regarding conditions for controlling the internal operations, a control logic configured to store the CAM data read out of the CAM cell array, and a microprocessor configured to perform a reprogramming operation on the CAM cell array using the CAM data stored in the control logic.

20 Claims, 4 Drawing Sheets

SEMICONDUCTOR DEVICE AND METHOD FOR OPERATING THE SAME

CROSS-REFERENCE TO RELATED APPLICATION

This application claims priority based upon Korean patent application No. 10-2013-0125143, filed on Oct. 21, 2013, the disclosure of which is hereby incorporated in its entirety by reference herein.

BACKGROUND

Embodiments of the present invention relate to a semiconductor device and a method for operating the same.

A flash memory device is a type of electrically erasable and programmable read-only memory (EEPROM) in which multiple memory regions can be erased or programmed by a single program action.

A system including a flash memory device can operate more quickly and more effectively than a system which simultaneously reads data from and writes data in other memory devices. All types of flash memory devices include cells that wear out after a predetermined number of erasing operations. This is because since an insulation film enclosing a charge storage element of a cell, which is configured to store data, is damaged by the erasing operations.

A flash memory device is designed to retain data stored therein even when not powered. That is, a flash memory device can retain the stored data without power consumption.

In addition, a flash memory device has excellent resistance to physical impact and a very high read access speed. As a result, flash memory devices have been widely used as storage devices in mobile products using battery power.

Flash memory devices are classified as NOR flash memory devices or NAND flash memory devices depending on the type of logic gates used in a storage unit of the flash memory devices.

A flash memory device is configured to store data in an array of transistors called cells. Flash memory devices may include a single-level cell or a multi-level cell. In a single-level cell device, a cell stores 1-bit data. In a multi-level cell device, a cell stores two or more bit data by changing the amount of charges on a floating gate of the cell.

In a flash memory device employing a floating gate, data retention characteristics and the number (or durability) of programming/erasing cycles are very important factors in determining the reliability of the flash memory device.

Charges (or electrons) stored in a cell of the flash memory device may leak from a floating gate through various failure mechanisms, for example, thermion emission and charge diffusion through a defective inter-poly insulation film, ion impurities, program disturbance stress, etc., resulting in reduction of a threshold voltage.

As the floating gate slowly accumulates charges while a power-supply voltage is applied to a control gate of the cell, an effect against charge acquisition may occur, resulting in an increased threshold voltage.

Repeated programming/erasing cycles may cause stress in oxide films of transistors in the flash memory device. Due to this stress, a failure may occur, such as a breakdown of a tunnel oxide film in the flash memory device.

A threshold voltage of a memory cell may gradually decrease due to the occurrence of such stress. In other words, electrons may leak from a floating gate of a programmed memory cell.

In sum, threshold voltage distribution of programmed memory cells moves to a lower voltage, such that some memory cells may have a threshold voltage lower than a program verification voltage. The reduction of the threshold voltage reduces a sensing margin in a read operation, and thus a read failure may occur.

Although a memory cell of a conventional memory device has non-volatile characteristics, cell data deterioration may occur over time under ordinary conditions. As a result, a data retention time is limited, and it is difficult to maintain the non-volatile characteristics, even under optimal conditions, for a long period of time.

If data stored in a non-volatile memory device is affected by deteriorated data retention characteristics, charge movement may occur over time, and thus a sensing margin of the data may be reduced. In this case, data necessary for controlling internal operations of the non-volatile memory device and stored in the non-volatile memory device may also change. Thereafter, a malfunction may occur when the non-volatile memory device operates in response to a user input.

BRIEF SUMMARY

Various embodiments of the present invention are directed to a semiconductor device and a method for operating the same, which substantially obviate one or more problems due to limitations and disadvantages of the related art.

An embodiment of the present invention relates to a technology for improving retention characteristics of data, such as information requisite for controlling internal operations of a semiconductor device, through the use of a reprogramming scheme.

In accordance with an embodiment, a semiconductor device includes: a content addressable memory (CAM) cell array configured to store data for internal operation conditions; a control logic configured to store CAM data by reading the data for the internal operation conditions; and a microprocessor configured to reprogram the CAM data stored in the control logic in the CAM cell array.

In accordance with another embodiment, a method for operating a semiconductor system includes: reading data of a content addressable memory (CAM) cell array configured to store data for internal operation conditions, and storing the read CAM cell array data in a page buffer; reading CAM data stored in the page buffer, and transferring the read CAM data to a control logic; checking an error of the CAM data, and storing the checked result in a register; and inputting repair data in the page buffer, and reprogramming data in the CAM cell array.

It is to be understood that both the foregoing general description and the following detailed description of embodiments are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF EMBODIMENTS

Reference will now be made in detail to various embodiments of the present invention, examples of which are illustrated in the accompanying drawings. Wherever possible, the same reference numbers will be used throughout the drawings to refer to the same or like parts.

Figure 1:
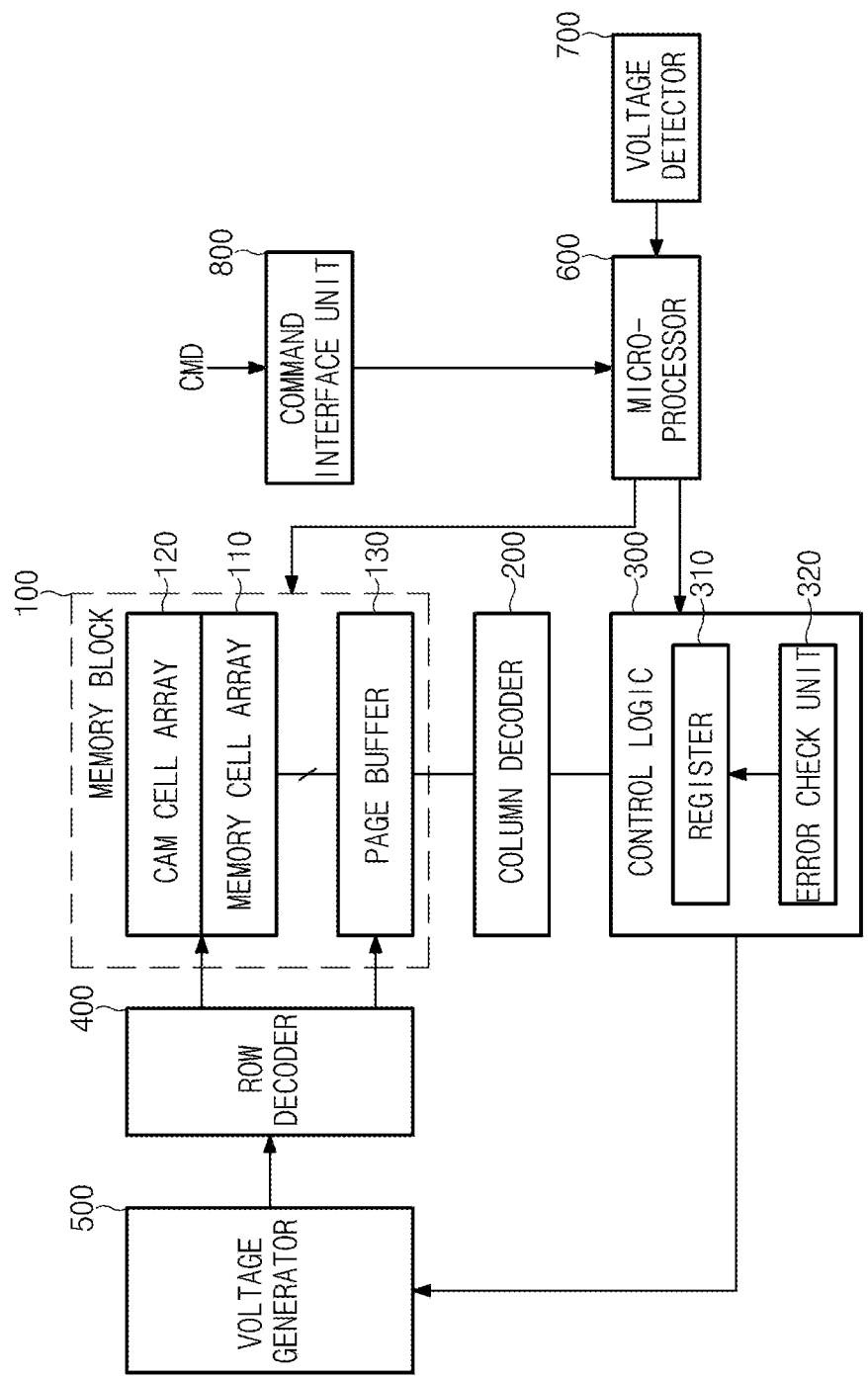
FIG. 1 is a block diagram illustrating a semiconductor device according to an embodiment.

FIG. 1 is a block diagram illustrating a semiconductor device according to an embodiment.

Referring to FIG. 1, the semiconductor device includes a memory block 100, a column decoder 200, a control logic 300, a row decoder 400, a voltage generator 500, a microprocessor 600, a voltage detector 700, and a command interface unit 800.

The memory block 100 includes a memory cell array 110, a content addressable memory (CAM) cell array 120, and a page buffer 130. The control logic 300 includes a register 310 and an error check unit 320. The memory cell array 110 and the CAM cell array 120 may have substantially the same structure and characteristics.

The memory cell array 110 includes a plurality of memory cells configured to store program data. The plurality of memory cells is coupled to word lines and bit lines. The memory cell array 110 may have a NAND string structure.

The CAM cell array 120 stores CAM data, e.g., information for controlling internal operations of the semiconductor device. The CAM cell array 120 may store option information needed for operating the semiconductor device. The option information may include program voltage information, read voltage information, erase voltage information, or thickness information of a gate oxide film of a memory cell. In addition, the CAM cell array 120 may store address information of a failed memory block and repair information.

The page buffer 130 is coupled to the bit lines of the memory cell array 110. The page buffer 130 may sense a bit line voltage during a read operation of the memory cell array 110, and output read data corresponding to the sensed bit line voltage to the column decoder 200. In addition, the page buffer 130 may temporarily store data to be programmed in the memory cell array 110 during a write (or program) operation.

The page buffer 130 may operate as a write driver or a sense-amplifier according to an operation mode. The page buffer 130 operates as the sense-amplifier in a read operation mode, and operates as the write driver in a program operation mode.

In an embodiment, the page buffer 130 is configured to read or program 1-bit data. In another embodiment, the page buffer 130 is configured to read or program more than one bit of data, e.g., 2-bit data. However, embodiments are not limited thereto. The page buffer 130 may include a plurality of unit page buffers.

The column decoder 200 may be configured to select the unit page buffers of the page buffer 130 in a predetermined number of units. In other words, the column decoder 200 may select columns of the memory cell array 110 in the predetermined number of units in response to a column address. As a result, a predetermined number of unit page buffers are activated in response to the column address, and a predetermined number of columns of the memory cell array 110 coupled to the activated unit page buffers are selected.

A memory device using non-volatile characteristics may store information regarding a specific condition therein. The information regarding the specific condition may include various types of bias levels or option information. In this embodiment, the information is stored in the CAM cell array 120 as the CAM data.

The information stored in the CAM cell array 120 is read out after being synchronized with a specific period or a specific command. The read-out information is stored in the register 310. The specific period may correspond to a power-on operation period. The information stored in the register 310 may be synchronized with a user input in a subsequent process, such that the stored information may be used for controlling internal operations of the semiconductor device.

The register 310 may further store erroneous data detected by the error check unit 310 and repair data thereof. The error check unit 320 may detect whether or not there is an error in cell data read out of the memory cell array 110 or whether or not there is an error in CAM data read out of the CAM cell array 120. The error check unit 310 may check the presence or absence of the error using a majority decision scheme, which will be described in detail below with an explanation of an operation of a semiconductor device in accordance with an embodiment.

The row decoder 400 selects one of the memory blocks in the semiconductor device, and selects one of the rows (or pages) of the selected memory block 100. That is, the row decoder 400 selects a word line of the memory block 100 in response to a row address.

The row decoder 400 may provide program and verification voltages to a selected word line in response to a drive voltage of the voltage generator 500. That is, the row decoder 400 may provide a program voltage to the selected word line and a pass voltage to non-selected word lines during the program operation.

In addition, the row decoder 400 may provide a read voltage to the selected word line during the read operation. That is, the selected row (page), i.e., the selected word line, may be driven by the row decoder 400 in response to a drive voltage from the voltage generator 500.

The voltage generator 500 may be configured to generate various drive voltages. The drive voltage may include a program voltage, an erase voltage, a read voltage, a program/erase verification voltage, a refresh verification voltage, etc.

The voltage generator 500 may generate a voltage having a level that changes according to a control signal of the control logic 300. For example, the refresh verification voltage may be determined according to which memory region the memory block 100 to be refreshed is included in.

The microprocessor 600 may output a control signal for controlling the memory block 100 and the control logic 300 based on an operation command signal from the command interface unit 800 and a detection signal, e.g., a power-on operation signal, from the voltage detector 700 during the read operation.

Upon receiving the power-on operation signal from the voltage detector 700, the microprocessor 600 may read out the CAM data stored in the CAM cell array 120 and store the read-out CAM data in the register 310. The microprocessor 600 may reprogram the CAM data in the CAM cell array 120 using the repair data stored in the register 310.

The voltage detector 700 detects an internal voltage of the semiconductor device and outputs a signal representing the detected voltage to the microprocessor 600. That is, the voltage detector 700 detects the internal voltage after completion of the power-on operation activated by power applied to the semiconductor device, and outputs a signal indicating the detection result of the power-on operation to the microprocessor 600. If the detected internal voltage is at a predetermined level or higher, the voltage detector 700 generates a power-on reset signal for enabling internal circuits to normally operate, and outputs the power-on reset signal to the microprocessor 600.

The command interface unit 800 is configured to interface with an external memory controller, a host system, or a computing system. The command interface unit 800 receives a command signal CMD as an input. In an embodiment, a reprogram operation on the CAM data is carried out in response to the command signal CMD received through the command interface unit 800.

Figure 2:
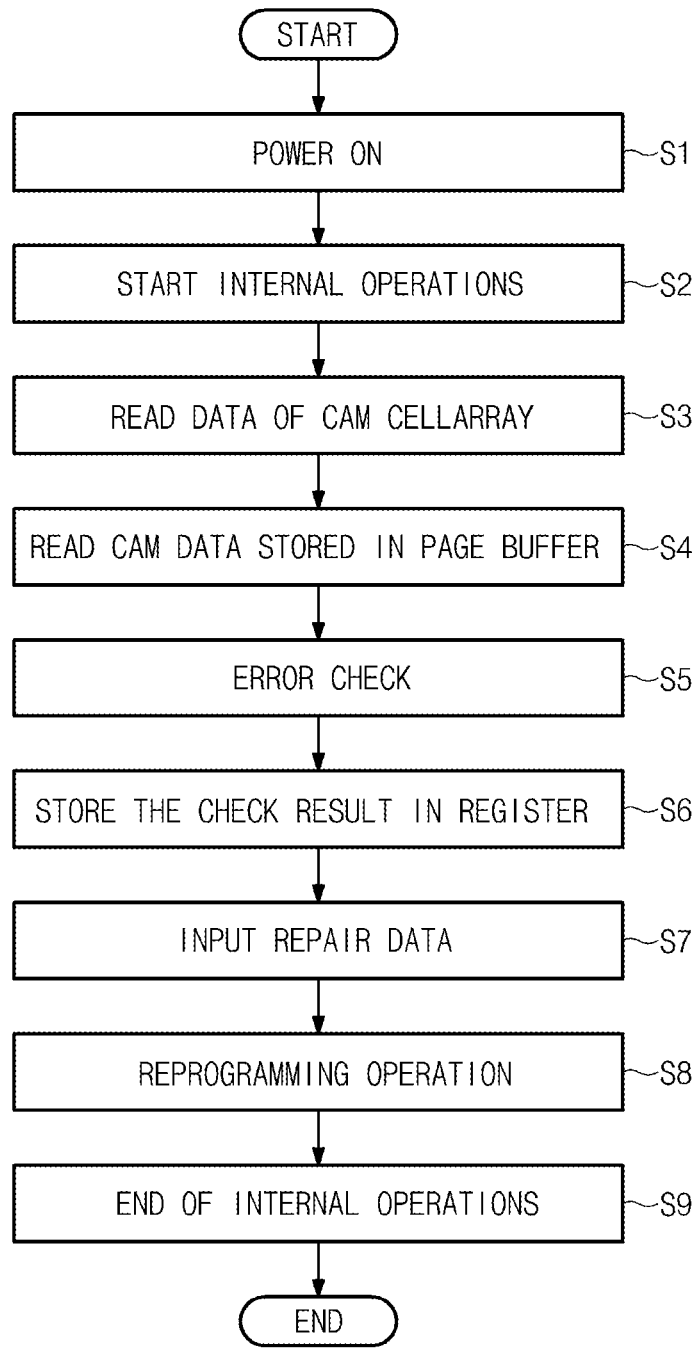
FIG. 2 is a flowchart illustrating a method for operating a semiconductor device according to an embodiment.

FIG. 2 is a flowchart illustrating a method for operating a semiconductor device according to an embodiment. The method will be described with reference to FIG. 1.

Referring to FIG. 2, if a power-on operation is performed in step S1, internal operations of the semiconductor device start so that the semiconductor device enters a busy state in which the memory block 100 begins to operate in step S2. The power-on operation may initialize the semiconductor device.

That is, the voltage detector 700 detects an internal voltage upon completion of the power-on operation, and outputs a signal indicating the detection result of the power-on operation to the microprocessor 600. CAM data for controlling internal operations, which is stored in the CAM cell array 120, is read out under the control of the microprocessor 600, and the read-out CAM data is stored in the page buffer 130 in step S3.

Generally, semiconductor memory devices have been designed to use a fuse unit and the like to store various types of information needed for controlling internal operations of the semiconductor memory devices. The information may include various types of information requisite for controlling the internal operations of a semiconductor memory device, for example, a unique characteristic value depending on characteristics of a memory cell, program pulses used in a program or erase operation, information regarding an erase pulse value, repair information, etc.

However, fuse units are often excessively large in size. In addition, if a package process is performed after information has been stored in a fuse unit, the fuse unit is unable to change the stored data.

In an embodiment as shown in FIG. 1, the CAM cell array 120 having, substantially the same structure as that of the memory cell array 110, substitutes for the fuse unit. Accordingly, even if the information needed for controlling the internal operations is stored in the CAM cell array 120 as the CAM data, the information, i.e., the CAM data, can be easily changed even after the semiconductor device is packaged as described hereinafter.

Referring back to FIG. 2, the CAM data stored in the page buffer 130 is transferred to the control logic 300 through the column decoder 200 upon receiving a control signal from the microprocessor 600 in step S4. The error check unit 320 of the control logic 300 checks the presence or absence of errors in the CAM data in step S5, and stores the checked results in the register 310 in step S6.

In an embodiment, the error check unit 320 checks the presence or absence of errors using a majority decision scheme. That is, validity/invalidity of the CAM data and repair address bits are determined according to a majority decision scheme.

For example, according to the majority decision scheme, if data read from four cell groups is denoted by '1101', one value '0' among '1101' is discarded, and bit information of the data is recognized as '1' based on the other three values '111'. That is, although an unexpected error occurs in the four bit values of the data due to the occurrence of a defective cell or noise, erroneous data may be recovered using a majority value of the four bit values.

The microprocessor 600 reads the CAM data out of the CAM cell array 120 before the semiconductor device receives a user input such as the command signal CMD input through the command interface unit 800, and then stores the CAM data in the register 310. The microprocessor 600 performs an operation corresponding to the user input using the CAM data stored in the register 310 in a subsequent process. In this embodiment, the CAM data of the CAM cell array 120 is read out prior to reception of the user input. However, embodiments are not limited thereto.

In another embodiment, the reading-out of the CAM data is synchronized with a specific command CMD received from a user within a time period after a power-on operation. That is, the microprocessor 600 reads the CAM data out of the CAM cell array 120 upon receiving the command signal CMD from the command interface unit 800, and performs reprogramming of the CAM data.

Thereafter, the control logic 300 provides repair data to the page buffer 130 through the column decoder 200 in step S7. That is, since a failed part generated in a fabrication process may affect a program step, the control logic 300 inputs the repair data to prevent the failed part from affecting the program step.

A reprogramming operation for the CAM cell array 120 is performed in response to the control signal of the microprocessor 600 in step S8. That is, the CAM data regarding conditions for controlling internal operations of the semiconductor device is reprogrammed after the fabrication of the semiconductor device.

A drive voltage of the voltage generator 500 is determined based on the CAM data stored in the register 310. In response to a high voltage generated by the voltage generator 500, the row decoder 400 may provide the drive voltage to a row line selected from the memory block 100. The CAM data stored in the register 310 is transferred to the CAM cell array 120 in response to the control signal of the microprocessor 600, such that the reprogramming operation is carried out.

If the CAM data of the CAM cell array 120 is reprogrammed, charges stored in cells and then lost from the cells can be compensated for, such that a data storage condition can be stably maintained over time.

In an embodiment, the reprogramming operation is performed in a busy state of the semiconductor device, but during a period in which the user does not input the operation command signal CMD. In an embodiment, the reprogramming operation is performed within a specific period after the power-on operation is completed such that changes to the CAM data, which is established in the CAM cell array 120 by a manufacturing company, are prevented after a predetermined time passes. In order to prevent access to the cells from being opened to the user, the established CAM data is not open to the user. Accordingly, it is essential to ensure the reliability of the CAM data.

Subsequently, if the reprogramming operation is completed, corresponding internal operations are ended, and then the semiconductor device enters an idle state in step S9. The idle state represents a standby state in which the semiconductor device awaits another external command input.

Figure 3:
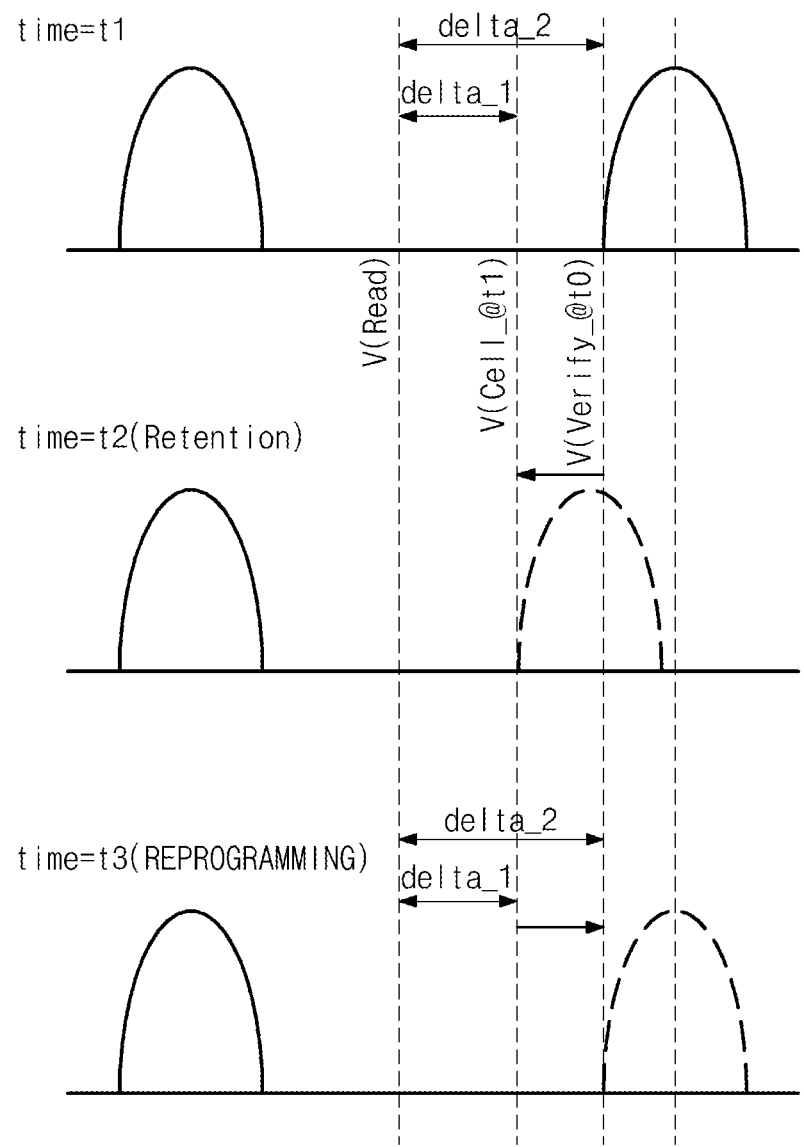
FIG. 3 is a conceptual diagram illustrating a data recovery mechanism of a semiconductor device according to an embodiment.

FIG. 3 is a conceptual diagram illustrating a data recovery mechanism of a semiconductor device according to an embodiment.

Referring to FIG. 3, a threshold voltage of a memory cell is gradually reduced due to stress generated as a programming/erasing cycle is repeated, and electrons are leaked from a floating gate of a programmed memory cell. Therefore, the threshold voltage distribution of programmed memory cells moves toward a lower voltage. As a result, some memory cells may have a lower threshold voltage than a program verification voltage.

Referring to FIG. 3, a memory cell has a normal threshold voltage at a time t1. However, as time passes, deterioration of cell data occurs. At time t2, data retention characteristics are deteriorated. As a result, some of the charges (electrons) stored in the memory cell may be lost, and thus a delta value delta_2 indicating a normal voltage margin of data is reduced to a delta value delta_1.

A semiconductor device according to an embodiment improves the data retention characteristics using a reprogramming scheme. Accordingly, after the reprogramming operation is performed on the memory cell, the delta value delta_1 is recovered to the delta value delta_2 at a time t3, resulting in increased reliability. A semiconductor device according to an embodiment may include a flash memory device. The flash memory device is a non-volatile memory device capable of maintaining stored data when powered off.

With the increasing number of users who use mobile devices such as cellular phones, PDAs, digital cameras, portable game consoles, MP3 players, and so on, a flash memory device has been widely used not only for data storage but also for code storage. The flash memory device can be applied to home applications, for example, HDTVs, DTVs, routers, global positioning systems (GPSs), etc.

Figure 4:
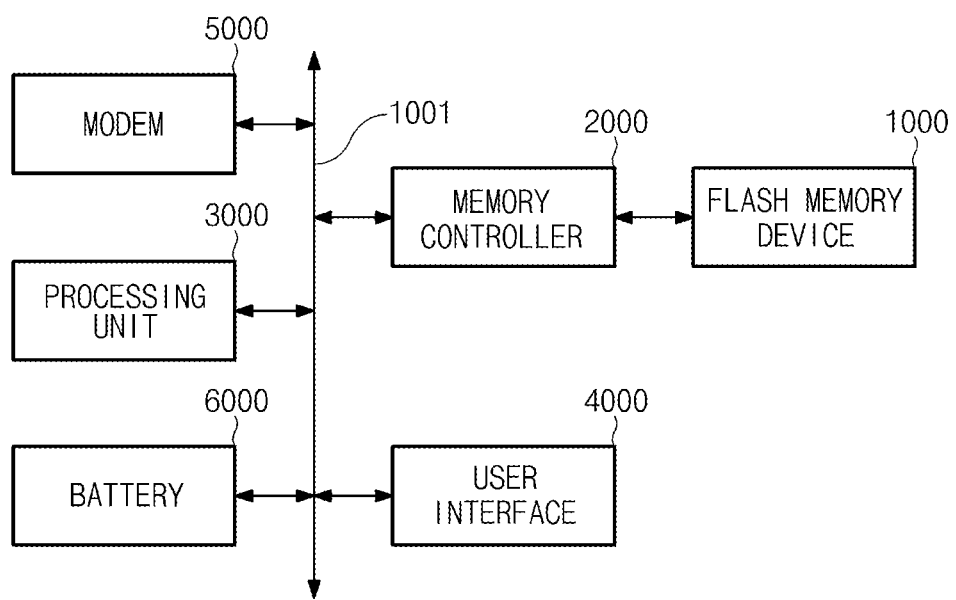
FIG. 4 is a block diagram illustrating a computing system including a semiconductor device according to an embodiment.

FIG. 4 is a block diagram illustrating a computing system including a semiconductor device according to an embodiment. The computing system includes a processing unit 3000 such as a microprocessor or a central processing unit (CPU), a user interface 4000, a modem 5000 such as a baseband chipset, a memory controller 2000, and a flash memory device 1000.

The flash memory device 1000 may be implemented using a semiconductor device in accordance with any embodiment described with reference to FIGS. 1 to 3. The flash memory device 1000 stores N-bit data (where N is a positive integer) processed or to be processed by the processing unit 3000 through the memory controller 2000.

If the computing system is a mobile device, the computing system further includes a battery 6000 for providing an operation voltage thereof. Although not shown in FIG. 4, those skilled in the art will understand that an application chipset, a camera image processor (CIS), a mobile DRAM, etc. can be further provided to the computing system without departing from the scope of the present invention.

As is apparent from the above description, a semiconductor device and a method for operating the same according to embodiments have the following effects.

First, data retention characteristics of CAM data requisite for controlling internal operations of the semiconductor device are improved using a reprogramming scheme, such that reliability of a data region configured to store the CAM data can be improved.

Second, since the reprogramming operation of the semiconductor device is carried out by a user command signal or without user assistance, the possibility of malfunction, which may be generated by reduction of a critical dimension (CD), is greatly reduced.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a content addressable memory (CAM) cell array configured to store CAM data regarding conditions for controlling internal operations of the semiconductor device;
   a control logic configured to store the CAM data read out of the CAM cell array and repair data corresponding to an error in the read-out CAM data; and
   a microprocessor configured to control a reprogramming operation on the CAM cell array using the read-out CAM data and the repair data stored in the control logic.

2. The semiconductor device according to claim 1, wherein the CAM data includes at least one of program voltage information, read voltage information, erase voltage information, and thickness information for a gate oxide film of a cell.

3. The semiconductor device according to claim 1, further comprising:
   a page buffer configured to read out the CAM data stored in the CAM cell array, temporarily store the read-out CAM data, and transfer the read-out CAM data to the control logic.

4. The semiconductor device according to claim 1, wherein the control logic includes:
   an error check unit configured to check whether or not there is an error in the CAM data read out of the CAM cell array; and
   a register configured to store the read-out CAM data and erroneous data detected by the error check unit.

5. The semiconductor device according to claim 4, wherein the error check unit is configured to detect whether or not there is an error using a majority decision scheme.

6. The semiconductor system according to claim 4, wherein the repair data corresponds to the erroneous data.

7. The semiconductor device according to claim 1, further comprising:
   a voltage detector configured to detect an internal voltage during a power-on operation and provide a signal indicating the detected voltage to the microprocessor.

8. The semiconductor device according to claim 7, wherein the microprocessor is configured to perform the reprogramming operation in response to the signal indicating the detected voltage after the power-on operation is completed.

9. The semiconductor device according to claim 1, further comprising:

a command interface unit configured to receive a command signal for performing the reprogramming operation from an external part, and provide the command signal to the microprocessor.

10. The semiconductor device according to claim 9, wherein the microprocessor is configured to perform the reprogramming operation upon receiving a specific command signal from the external part.

11. The semiconductor device according to claim 1, further comprising:
a voltage generator configured to generate a voltage based on the read-out CAM data stored in the control logic.

12. The semiconductor device according to claim 11, further comprising:
a row decoder configured to select a row line of the CAM cell array; and
a column decoder configured to select a column line of the CAM cell array.

13. The semiconductor device according to claim 1, wherein the CAM cell array is configured to perform a reprogramming operation in the same CAM cell array according to a control signal of the microprocessor.

14. The semiconductor system according to claim 1, wherein the microprocessor is configured to re-program data in the CAM cell array in response to the repair data stored in a register of the control logic.

15. A method for operating a semiconductor device, the method comprising:
reading data out of a content addressable memory (CAM) cell array, the data including information regarding conditions for controlling internal operations of the semiconductor device, and storing the read-out data in a register;
detecting an error in the read-out data, and storing repair data corresponding to the error in the register; and
reprogramming data in the CAM cell array using the read-out data and the repair data stored in the register.

16. The method according to claim 15, wherein reading the data is performed within a predetermined period after a power-on operation is completed.

17. The method according to claim 15, wherein the information regarding conditions for controlling the internal operations includes at least one of program voltage information, read voltage information, erase voltage information, and thickness information for a gate oxide film of a cell.

18. The method according to claim 17, wherein detecting the error is performed using a majority decision scheme.

19. The method according to claim 17, wherein reprogramming the data is performed in response to a specific command signal received from an external part.

20. The method according to claim 15, wherein the CAM cell array is configured to perform a reprogramming operation in the same CAM cell array.

* * * * *